(12) United States Patent
Gong et al.

(10) Patent No.: US 6,240,117 B1
(45) Date of Patent: May 29, 2001

(54) FLUORINE CONTROL SYSTEM WITH FLUORINE MONITOR

(75) Inventors: Mengxiong Gong, San Marcos; Tom A. Watson, Carlsbad; Palash P. Das, Vista; Richard L. Sandstrom, Encinitas; Thomas P. Duffey, San Diego, all of CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 09/191,446

(22) Filed: Nov. 12, 1998

Related U.S. Application Data

(63) Continuation-in-part of application No. 09/016,525, filed on Jan. 30, 1998, now Pat. No. 5,978,406, and a continuation-in-part of application No. 09/109,596, filed on Jul. 2, 1998, now Pat. No. 6,028,880.

(51) Int. Cl.$^7$ .................................................... H01S 3/223
(52) U.S. Cl. .............................. 372/58; 372/58; 372/96; 372/57
(58) Field of Search ............................... 372/58, 103, 96, 372/57, 59, 55

(56) References Cited

U.S. PATENT DOCUMENTS

| | | |
|---|---|---|
| 4,031,484 | 6/1977 | Freiberg et al. . |
| 4,429,392 | 1/1984 | Yoshida et al. . |

(List continued on next page.)

FOREIGN PATENT DOCUMENTS

| | | |
|---|---|---|
| 3-194991 | 8/1991 | (JP) . |
| 3-57632 | 9/1991 | (JP) . |
| 4-029385 | 1/1992 | (JP) . |
| 4-29386 | 1/1992 | (JP) . |
| 4-120782 | 4/1992 | (JP) . |
| 3-135089 | 6/1992 | (JP) . |
| 4-334079 | 11/1992 | (JP) . |
| 5-291650 | 11/1993 | (JP) . |
| 5-347448 | 12/1993 | (JP) . |
| 7-122800 | 5/1995 | (JP) . |

OTHER PUBLICATIONS

Hayes, Larry J. and Feldman, Josef, "Development of a Continuous Fluorine and Hydrogen Fluoride Analyzer", ISA ASI 75277, 1975, pp. 451–456.

(List continued on next page.)

Primary Examiner—Frank G. Font
Assistant Examiner—Delma R. Flores Ruiz
(74) Attorney, Agent, or Firm—John R. Ross, Esq.

(57) ABSTRACT

An excimer laser system with a real time fluorine monitor and an automatic fluorine control system to permit precise control of the fluorine concentration within the laser chamber. Cleaned laser gas is extracted from the laser chamber and directed through an $F_2$ sample cell prior to returning to the chamber through one of the chamber window housings. A UV light beam is directed through the $F_2$ sample cell and the amount of absorption of the light is measured. In preferred embodiments the absorption is measured by detecting with a photo detector the amount of light which passes through the cell. The photo detector provides a feedback signal which is used by a laser controller to automatically control fluorine concentration in the chamber to within desired ranges. In another preferred embodiment an acoustic detector detects acoustic signals resulting from absorbed light pulses. This invention provides a substantially real time measurement of fluorine concentration.

39 Claims, 9 Drawing Sheets

U.S. PATENT DOCUMENTS

| | | |
|---|---|---|
| 4,674,099 | 6/1987 | Turner . |
| 4,722,090 | 1/1988 | Haruta et al. . |
| 4,740,982 | 4/1988 | Haruta et al. . |
| 4,831,332 | 5/1989 | Rudisill et al. . |
| 4,893,108 | 1/1990 | Kolesar, Jr. . |
| 4,977,749 | 12/1990 | Sercel . |
| 5,005,181 | 4/1991 | Yoshioka et al. . |
| 5,017,499 | 5/1991 | Hakuta et al. . |
| 5,065,140 | 11/1991 | Neuburger . |
| 5,073,896 | 12/1991 | Reid et al. . |
| 5,090,020 | 2/1992 | Bedwell . |
| 5,149,659 | 9/1992 | Hakuta et al. . |
| 5,199,267 | 4/1993 | Mitsui . |
| 5,377,215 * | 12/1994 | Das et al. ............................... 372/57 |
| 5,440,578 | 8/1995 | Sandstrom . |
| 5,450,436 | 9/1995 | Mizoguchi et al. . |
| 5,642,374 | 6/1997 | Wakabayashi et al. . |
| 5,856,991 * | 1/1999 | Ershov ................................... 372/57 |
| 5,978,406 * | 11/1999 | Rokni et al. ........................... 372/58 |
| 6,028,880 * | 2/2000 | Carlesi et al. ......................... 372/58 |

OTHER PUBLICATIONS

Rosengren, Lars–Goran, "Optimal optoacoustic detector design", Applied Optics, vol. 14, No. 8, Aug. 1975, pp. 1960–1976.

Kamm, Roger D., "Detection of weakly absorbing gases using a resonant optoacoustic method", Journal of Applied Physics, vol. 47, No. 8, Aug. 1976, pp. 3550–3558.

Kritchman, E., Shtrikman, S. and Slatkine, M., "Resonant optoacoustic cells for trace gas analysis", J. Opt. Soc. Am., vol. 68, No. 9, Sep. 1978, pp. 1257–1271.

Gerlach, R. and Amer, M., Brewster Window and Windowless Resonant Spectrophones for Intracavity Operation, Appl. Phys., 23, 1980, pp. 319–326.

Miklos, A. and Lorincz, "Windowless Resonant Acoustic Chamber for Laser–Photoacoustic Applications", Appl. Phys., B 48, 1989, pp. 213–218.

* cited by examiner

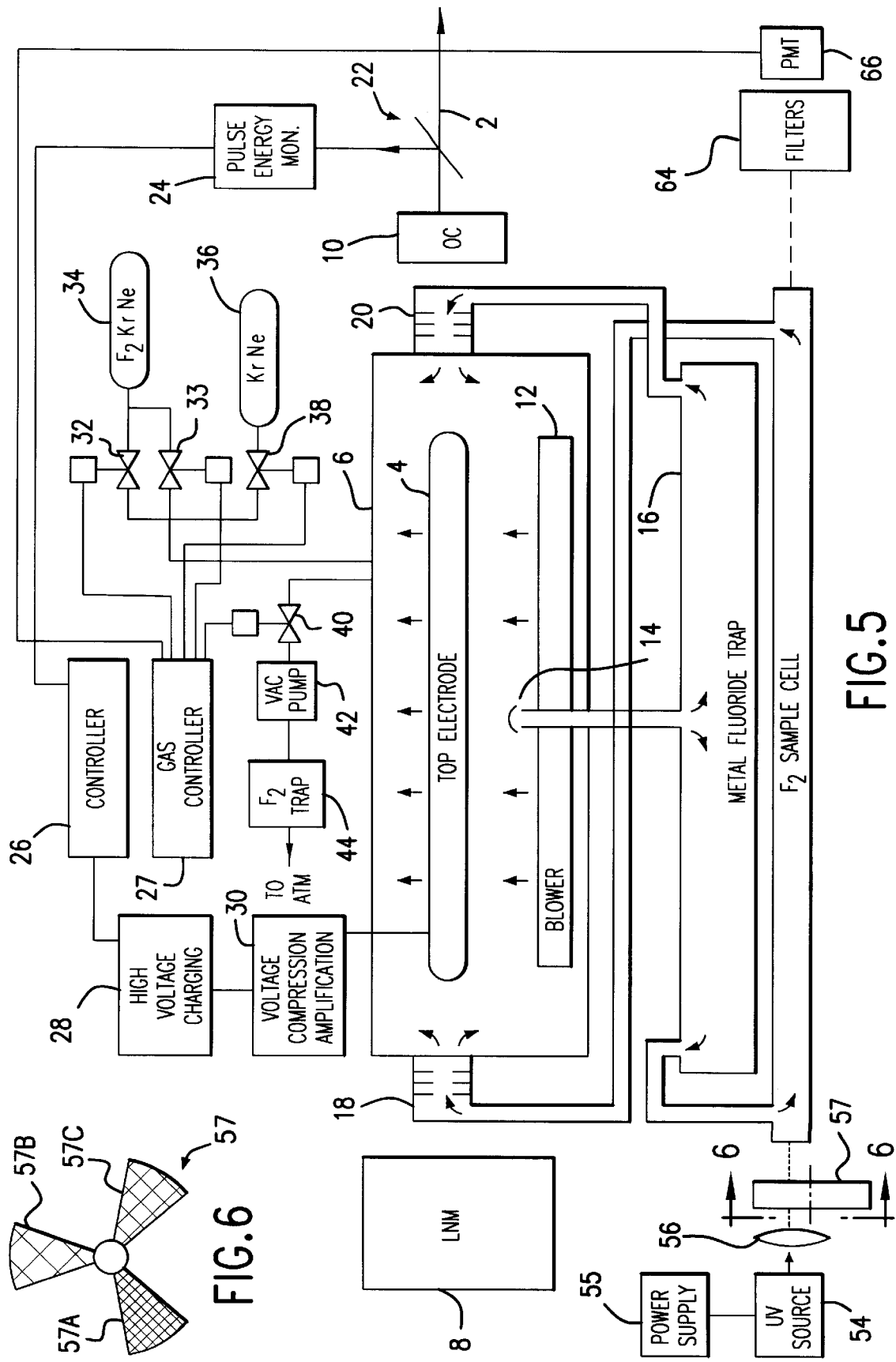

FLUORINE CONTROL SYSTEM WITH FLUORINE MONITOR

This application is a continuation-in-part of Ser. No. 09/016,525, filed Jan. 30, 1998 now U.S. Pat. No. 5,978,406 issued date Nov. 2, 1999 entitled "Fluorine Control System for Excimer Laser" and Ser. No. 09/109,596 filed Jul. 2, 1998 now U.S. Pat. No. 6,028,880 issue date Feb. 22, 2000 entitled "Automatic Fluorine Control System". This invention relates to excimer lasers and in particular for equipment and methods for controlling laser gas in excimer lasers.

BACKGROUND OF THE INVENTION

Excimer lasers are well known. An important use of excimer lasers is to provide the light source for integrated circuit lithography. The type of excimer laser currently being supplied in substantial numbers for integrated circuit lithography is the KrF laser which produces ultraviolet light at a wavelength of 248 nm. A similar excimer laser, the ArF laser, provides ultraviolet light at 193 nm, and an $F_2$ laser operates at 157 nm. These lasers typically operate in a pulse mode at pulse rates such as 1,000 Hz. The laser beam is produced in a laser chamber containing a gain medium created by the discharge through a laser gas between two elongated electrodes of about 28 inches in length and separated by about 5/8 inch. The discharge is produced by imposing a high voltage such as about 20,000 volts across the electrodes. For the KrF laser, the laser gas is typically about 1% krypton, 0.1% fluorine and about 99% neon. For the ArF laser the gas is typically about 3 to 4% argon, 0.1% fluorine and 96 to 97% neon. The F2 laser is about 0.15% $F_2$ and the rest He. In both cases in order to achieve high pulse rates of about 1,000 Hz, the gas must be circulated between the electrodes at speeds of about 500 to 1,000 inches per second.

Fluorine is the most reactive element known and it becomes even more reactive when ionized during the electric discharge. Special care must be exercised to utilize in these laser chambers materials such as nickel coated aluminum which are reasonably compatible with fluorine. Further, laser chambers are pretreated with fluorine to create passification layers on the inside of the laser chamber walls. However, even with this special care, fluorine will react with the walls and other laser components producing metal fluoride contaminants and resulting in a relatively regular depletion of the fluorine gas. The rates of depletion are dependent on many factors, but for a given laser at a particular time in its useful life, the rates of depletion depend primarily on the pulse rate and load factor if the laser is operating. If the laser is not operating, the depletion rate is substantially reduced. The rate of depletion is further reduced if the gas is not being circulated. To make up for this depletion, new fluorine is typically injected at intervals of about 1 to 3 hours. Rather than inject pure fluorine it is a typical practice to inject into KrF lasers a mixture of 1% fluorine, 1% krypton and 98% neon. For example, in a specifically treated high quality 1000 Hz KrF excimer laser used for lithography, the quantity of its fluorine, krypton, neon mixture injected to compensate for the fluorine depletion varies from about 5 scc per hour when the laser is not operating and the laser gas is not being circulated to about 180 scc per hour when the laser is running continuously at 1000 Hz. The typical injection rate is about 10 scc per hour when the chamber fan is circulating the laser gas, but the laser is not firing.

The unit "scc" refers to "standard cubic centimeters". Other commonly used units for describing quantities of fluorine in a particular volume are percent (%) fluorine, parts per million and kilo Pascals; the latter term sometimes refers to the partial pressure of the fluorine gas mixture. (This is because the amount of fluorine injected into a laser chamber is typically determined (directly or indirectly) by the measured chamber pressure increase while the 1% fluorine gas mixture is being injected.) A 195 scc per hour injection rate of the 1% fluorine mixture would correspond to a depletion in the fluorine concentration over 2 hours from about 0.10 percent to about 0.087 percent. The actual quantity of fluorine depleted in two hours as measured in grams of pure fluorine would be about 17 milligrams during the two hour period corresponding to the above 320 scc/hour injection rate (i.e., 390 scc of the 1% fluorine mixture injected at two-hour intervals) of the fluorine gas mixture.

For integrated circuit lithography a typical mode of operation requires laser pulses of constant pulse energy such as 10 mJ/pulse at about 1000 Hz which are applied to wafers in bursts such as about 300 pulses (with a duration of about 300 milliseconds) with a dead time of a fraction of a second to a few seconds between bursts. Modes of operation may be continuous 24 hours per day, seven days per week for several months, with scheduled down time for maintenance and repairs of, for example, 8 hours once per week or once every two weeks. Therefore, these lasers must be very reliable and substantially trouble-free.

In typical KrF and ArF excimer lasers used for lithography, high quality reproducible pulses with desired pulse energies of about 10 mJ/pulse for KrF and 5 mJ/pulse for ArF may be obtained over a substantial range of fluorine concentration from about 0.08 percent to about 0.12 percent. Over the normal laser operating range the discharge voltage required to produce the desired pulse energy increases as the fluorine concentration decreases (assuming other laser parameters remain approximately constant). FIG. 1 shows the typical relationship between discharge voltage and fluorine concentration for constant pulse energy of 10 mJ and 14 mJ. The discharge voltage in the range of 15 kv to 20 kv is typically controlled by a feedback system which calculates a charging voltage (in the range of about 550 volts to 800 volts) needed to produce (in a pulse compression-amplification circuit) the needed discharge voltage which is needed to produce the desired laser pulse energy. This feedback circuit therefore sends a "command voltage" signal a power supply to provide charging voltage pulses.

Prior art techniques typically utilize the relationship between discharge voltage and fluorine concentration to maintain constant pulse energy despite the continuous depletion of fluorine. The discharge voltage of prior art excimer lasers can be changed very quickly and accurately and can be controlled with electronic feedback to maintain constant pulse energy. Accurate and precise control of fluorine concentration in the past has proven difficult. Therefore, in typical prior art KrF and ArF laser systems, the fluorine concentration is allowed to decrease for periods of about 1 to 4 or 5 hours while the discharge voltage is adjusted by a feedback control system to maintain constant pulse energy output. Periodically at intervals of about 1 to a few hours, fluorine is injected during short injection periods of a few seconds. Thus, in normal operations fluorine concentration gradually decreases from (for example) about 0.10 percent to about 0.09 percent over a period of about 1 to a few hours while the charging voltage is increased over the same period from, for example, about 600 volts to about 640 volts. The injection of fluorine at the end of the 1 to a few hour period (when the voltage has drifted up to about 640 volts) brings the fluorine concentration back to about 0.10 percent and the feedback control (maintaining constant pulse energy) automatically reduces the voltage back to 600 volts. This basic process is typically repeated for several days. Injections are typically performed automatically as controlled by a controller based on specially crafted control algorithms. As shown in FIG. 2, prior art excimer lasers typically divert a portion of the chamber gas flow through a metal fluoride trap to remove contamination. Laser beam 2 is produced in a gain medium between electrodes 4 (only the top electrode is shown in FIG. 2) in chamber 6 in a resonance cavity defined by line narrowing module 8 and output coupler 10. Laser gas is circulated between the electrodes 4 by tangential blower 12. A small portion of the circulating flow is extracted at port 14 downstream of blower 12 and directed through metal fluoride trap 16 and clean gas is circulated back into the chamber through window housings 18 and 20 to keep the windows free of laser debris. A very small portion of each laser pulse is sampled by beam splitter 22 and pulse energy monitor 24, and in an extremely fast feedback control loop, controller 26 controls the electrode discharge voltage to maintain pulse energy within a desired range by regulating a high voltage charging circuit 28 which provides charging current to voltage compression and amplification circuit 30 which in turn provides very high voltage electrical pulses across electrodes 4. Over a longer term controller 26 through gas controller 27 also controls the fluorine concentration in the chamber 6 by regulating fluorine injections at control valve 32. Special control algorithms will periodically inject predetermined quantities of fluorine. These injections may be called for when the high voltage has increased to a predetermined limit or injection may be made after a predetermined number of pulses such as 3 million pulses or after the passage of a predetermined period of time (such as six hours with no lasing) or a combination of pulses, time and voltage. Typically two gas supplies are available. A typical fluorine source 34 for a KrF laser is 1% $F_2$, 1% Kr and 98% Ne. A buffer gas source 36 of 1% Kr and 99% Ne may also be tapped by controller 26 through valve 38 when providing an initial or a refill of the chamber or if the $F_2$ concentrations for some reason gets too high. It Laser gas may be exhausted through valve 40 and the chamber may be drawn down to a vacuum by vacuum pump 42. Exhaust gas is cleaned of $F_2$ by $F_2$ trap 44. FIG. 3 shows the results of the prior art fluorine injection techniques discussed above. The voltage values represent average values of control voltage commands and indirectly represent average values of charging voltage. Since contamination gradually builds up in the laser gas over a period of several days, it is usually desirable to replace substantially all of the gas in the laser with new laser gas at intervals of about 5–10 days.

The above-described prior art technique is effectively used today to provide long term reliable operation of these excimer lasers in a manufacturing environment. However, several laser parameters, such as bandwidth, beam profile and wavelength stability, are adversely affected by the substantial swings in the discharge voltage and fluorine concentration.

A substantial number of techniques have been proposed and patented for measuring and controlling the fluorine concentration in excimer lasers to within more narrow limits than those provided under the above described prior art technique. These techniques have generally not been commercially pursued. Prior art commercial excimer lasers typically do not have a fluorine monitor. A need for a good, inexpensive, reliable, real-time fluorine monitor has been recognized for a long time.

Techniques for measuring trace gas concentrations with light beams are well known. One such technique uses a photo detector to determine the absorption of a beam as it passes through an absorption cell. Another technique well known since it was first discovered by Alexander Graham Bell involves the creation of sound waves in an absorption cell with an intensely modulated light beam. See Optimal Optoacoustic Detector Design, Lars-Goran Rosengren, Applied Optics Vol. 14, No. 8/August 1975 and Brewsters Window and Windowless Resonance Spectrophones for Intercavity Operations, R. Gerlach and N. M. Amer, Appl. Phys. 23, 319–326 (1980).

What is needed is a better system and method for dealing with the issue of fluorine depletion in KrF and ArF excimer lasers.

SUMMARY OF THE INVENTION

The present invention provides an excimer laser system with a real time fluorine monitor and an automatic fluorine control system to permit precise control of the fluorine concentration within the laser chamber.

Applicants have discovered that the beam parameters such as pulse energy stability, wavelength stability and band width are very sensitive to changes in the fluorine concentration. They have also learned from experience that as a laser ages the fluorine concentration which provides the best combination of beam parameters may vary. Also, as stated in the background section, it is well known that at a particular point in the life of a laser, an increase in the fluorine concentration will result in a decrease in the discharge voltage and that laser life is shortened by both high discharge voltage and by high fluorine concentration. Thus, there is a need for careful selection of the fluorine concentration both for the purposes of assuring good beam parameters and achieving long laser lifetimes. This selection involves intelligent tradeoff decisions, and once those tradeoff decisions are made a fluorine concentration "sweet spot" is determined which represents the most desirable range of fluorine concentration. When this sweet spot determination has been made, it is important to operate the laser within the fluorine concentration sweet spot. This is done by providing a fluorine monitor which monitors the fluorine concentration and provides a feedback signal to an automatic control system to operate the laser within the sweet spot. Cleaned laser gas is extracted at the exit port of a metal fluoride trap and directed through an $F_2$ sample cell prior to returning to the chamber through one of the chamber window housings. A UV light beam is directed through the $F_2$ sample cell and the amount of absorption of the light is measured. In preferred embodiments the absorption is measured by detecting with a photo detector the amount of light which passes through the cell. The photo detector provides a feedback signal which is used by a laser controller to automatically control fluorine concentration in the chamber to within desired ranges. In another preferred embodiment an acoustic detector detects acoustic signals resulting from absorbed light pulses. This invention provides a substantially real time measurement of fluorine concentration.

BRIEF DESCRIPTION OF THE DRAWINGS

FIGS. 4, 5, 8, and 9 are schematic drawings showing a preferred embodiment of the present invention.

FIG. 6 is a drawing of a rotating filter device.

DETAILED DESCRIPTION OF PREFERRED EMBODIMENTS

UV Absorption in Fluorine $F_2$ displays relatively strong absorption of ultraviolet light in the range 280 nm–290 nm (its maximum absorption is at 284.5 nm with an absorption coefficient of $3.5 \times 10^{-4}$ $(\text{cm torr})^{-1}$), while Kr, Ne and Ar and expected levels of excimer laser impurities are virtually transparent in this range. Thus, measurements of attenuation of a UV light beam passing through the gas mixture can determine the fluorine concentration.

First Preferred Embodiment

Figure 2:
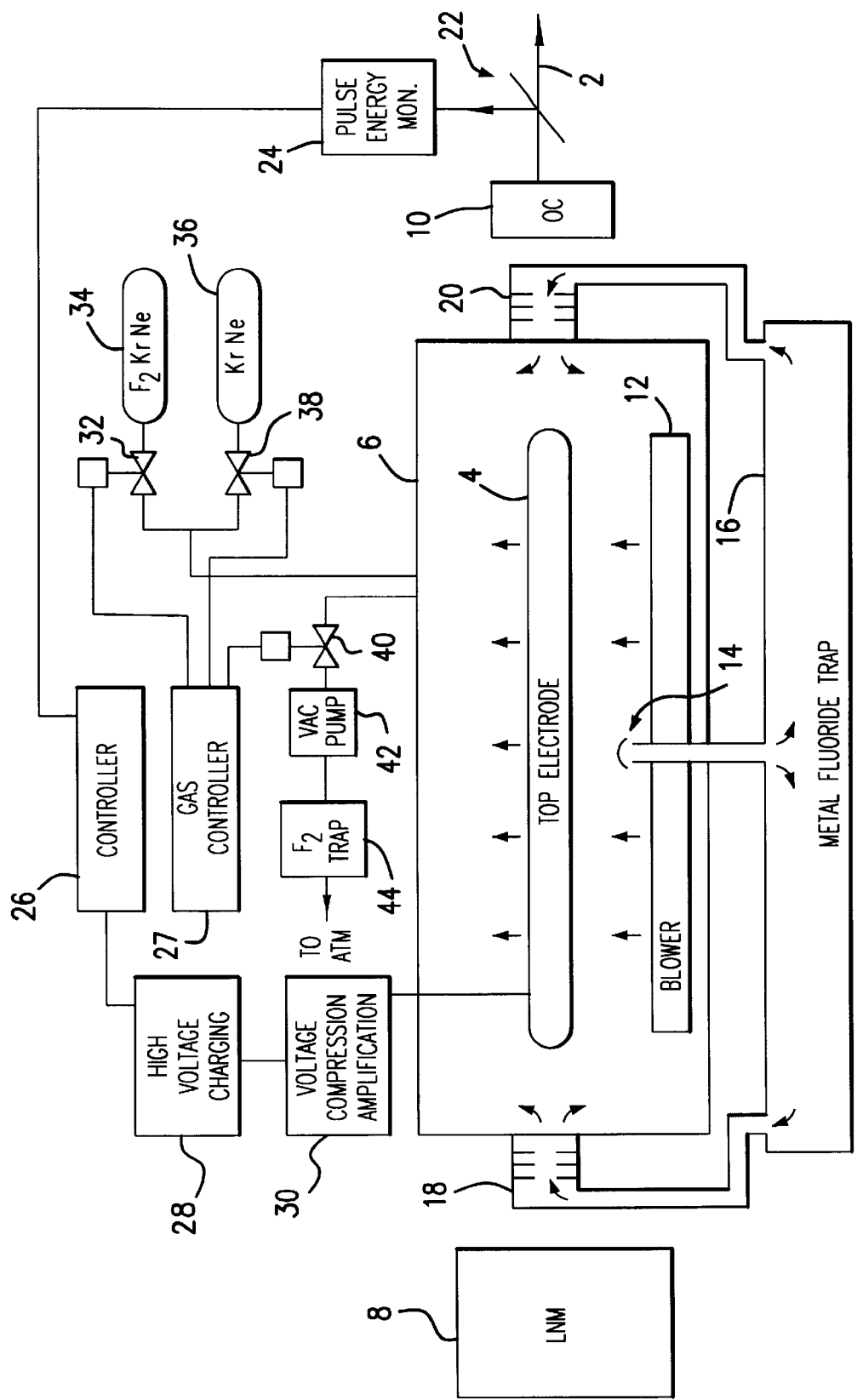
FIG. 2 is a schematic drawing of a prior art excimer laser system.
Figure 4:
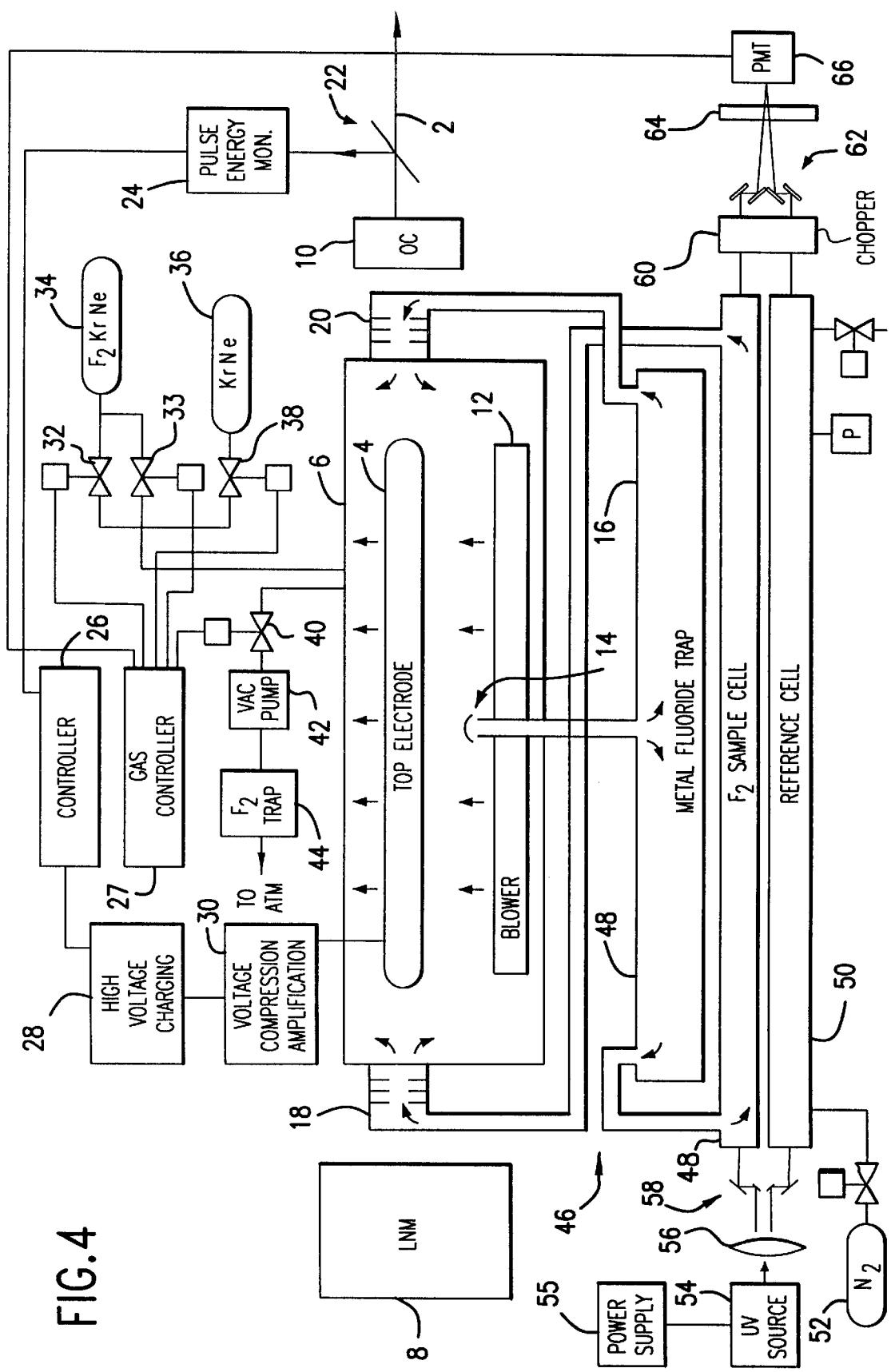
Figure 7:
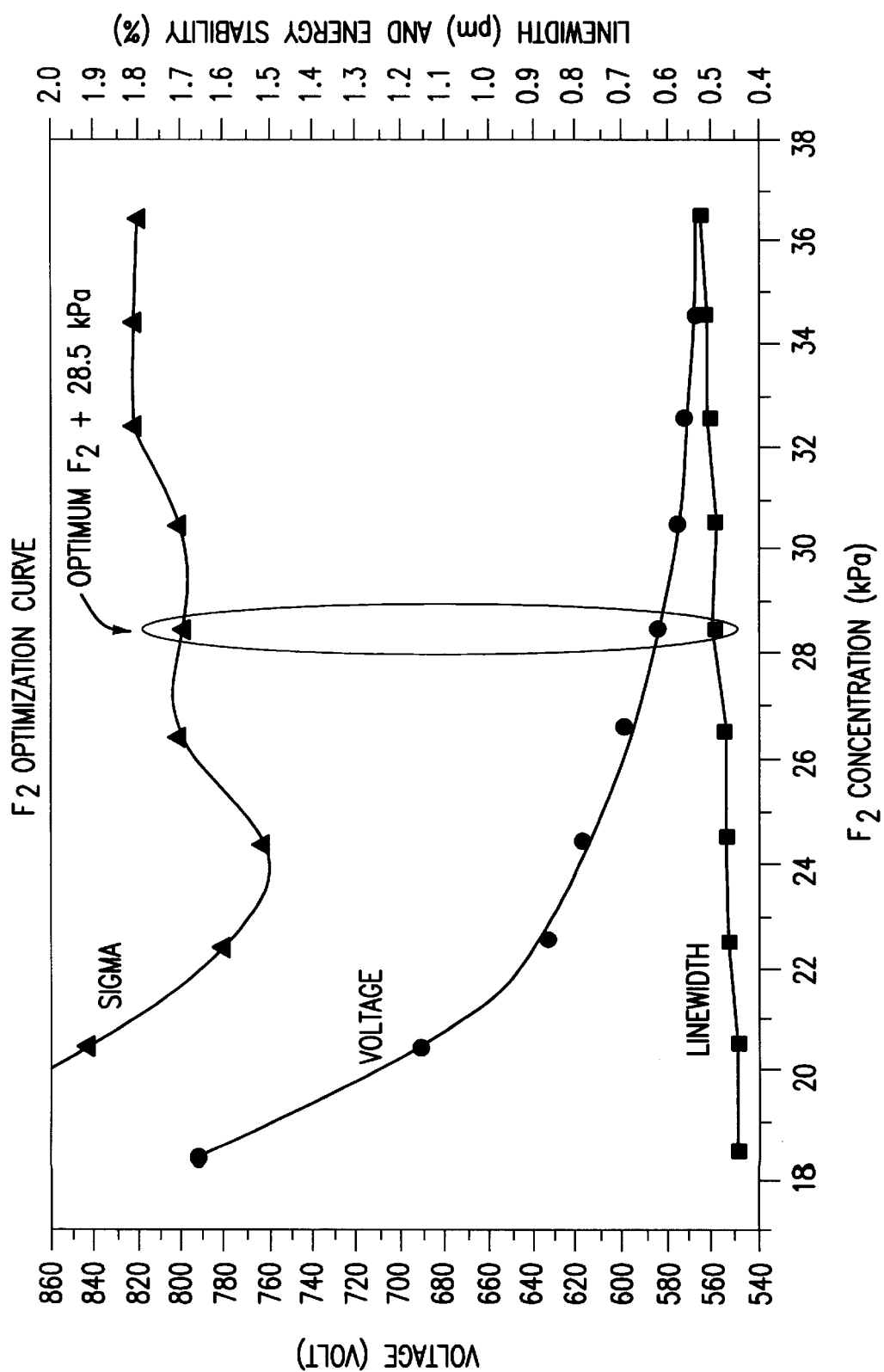
FIG. 7 shows a curve for optimizing fluorine concentration.

A first preferred embodiment of the present invention can be described by reference to FIG. 4. In this embodiment we have improved the prior art laser system shown in FIG. 2 with the addition of a fluorine monitor and feedback controls to permit the laser computer controls to monitor and control the fluorine concentration to assure that the laser is at all times operating within desired fluorine concentration ranges.

We have tapped at 46 into the line leading from metal fluorine trap 16 to laser window housing 18 and directed clean gas flow from the left half of metal trap 16 into $F_2$ sample cell 48. The gas detures at a flow rate of about 600 cc's per second through half inch diameter $F_2$ sample cell 48 then back to laser housing 18. A reference cell 50 of the same construction as cell 48 is installed adjacent to cell 48. Cell 50 is filled with $N_2$ from source 52 to about the same pressure as laser chamber 6. A 30 watt (Model 63163) deuterium lamp 54, available from Oriel Corporation with offices in Stratford, Conn. provides an ultraviolet beam down to 160 nm. Lens 56 collimates the beam from lamp 54 and the beam is separated into two beams by four-mirror separator 58 with one of the new beams passing through $F_2$ sample cell 48 and with the other of the new beams passing through reference cell 50. The two beams are chopped by chopper 60 which is a five-blade fan driven at 200 Hz and redirected by four-mirror combiner 62 so that they are alternatively filtered by filter 64 having FWHM bandpass of 10±2 nm and centered at 280 nm (a suitable is Melles Griot Model O3FIM018) and monitored by photo multiplier tube 66 which is in this embodiment an Oriel Model 77348. The signal from tube 66 is analyzed by gas controller 27 to determine the fluorine concentration and in turn operate valve 32 (and if necessary valve 38) in a feedback routine in order to maintain the fluorine concentration within desired ranges. Preferably valve 32 is a very low flow control valve capable of flows in the $cm^3/min$ range. For more rapid injection or initial fills valve 33 could be used.

The windows of both cells are calcium fluoride ($CaF_2$). Both cells are preferable calibrated using well known techniques. Preferably transmission through both cells are measured under vacuum conditions to establish a zero gas absorption reference point. Preferably also two or more known $F_2$ mixtures are used to calibrate the cells. Also the system can be calibrated using the Beer-Lambert law:

$$A = \log_{10}(I_0/I) = \epsilon c l$$

Here  A - absorbency  $I_0$ - initial intensity of UV beam
$\epsilon$ - molar absorption coefficient  I - final intensity of UV beam
c - concentration of absorbing material  l - length of absorption cell $F_2$ concentration or the partial pressure of $F_2$ can be obtained based on the formula above.

Second Preferred Embodiment

A second preferred embodiment can be described by reference to FIG. 5. In this case only a single cell 48 is used but it preferably is set up as in the first preferred embodiment. Instead of the reference cell, this embodiment uses at least two filters having known absorptions to calibrate the system. A preferred arrangement utilizes a rotating filter 57 which is shown with a facing view in FIG. 6. Rotating filter 57 comprises three blades one 57A being a block, one 57B having a known relatively low absorption and one 57C having a known relatively high absorption. Preferably a step motor controls rotating filter 57. The system is calibrated by pulling a vacuum on the entire laser system and taking data with each of the filter blades in the beam path and with no blade in the path. If desired a calibration point preferably could be obtained with a known $F_2$ concentration in the chamber and the reference cell.

Third Preferred Embodiment

Acoustic Monitor

Figure 8:
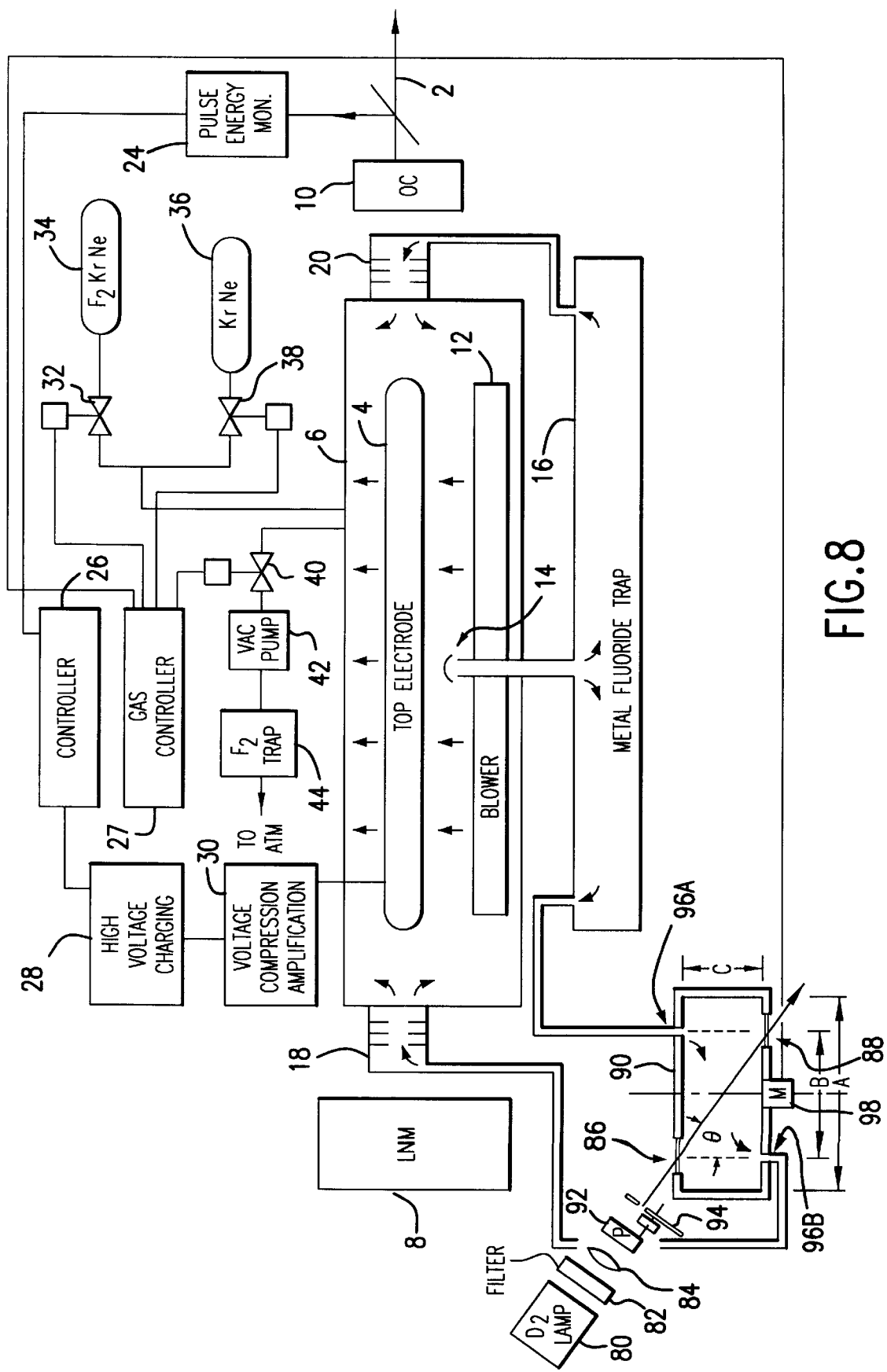
Figure 10:
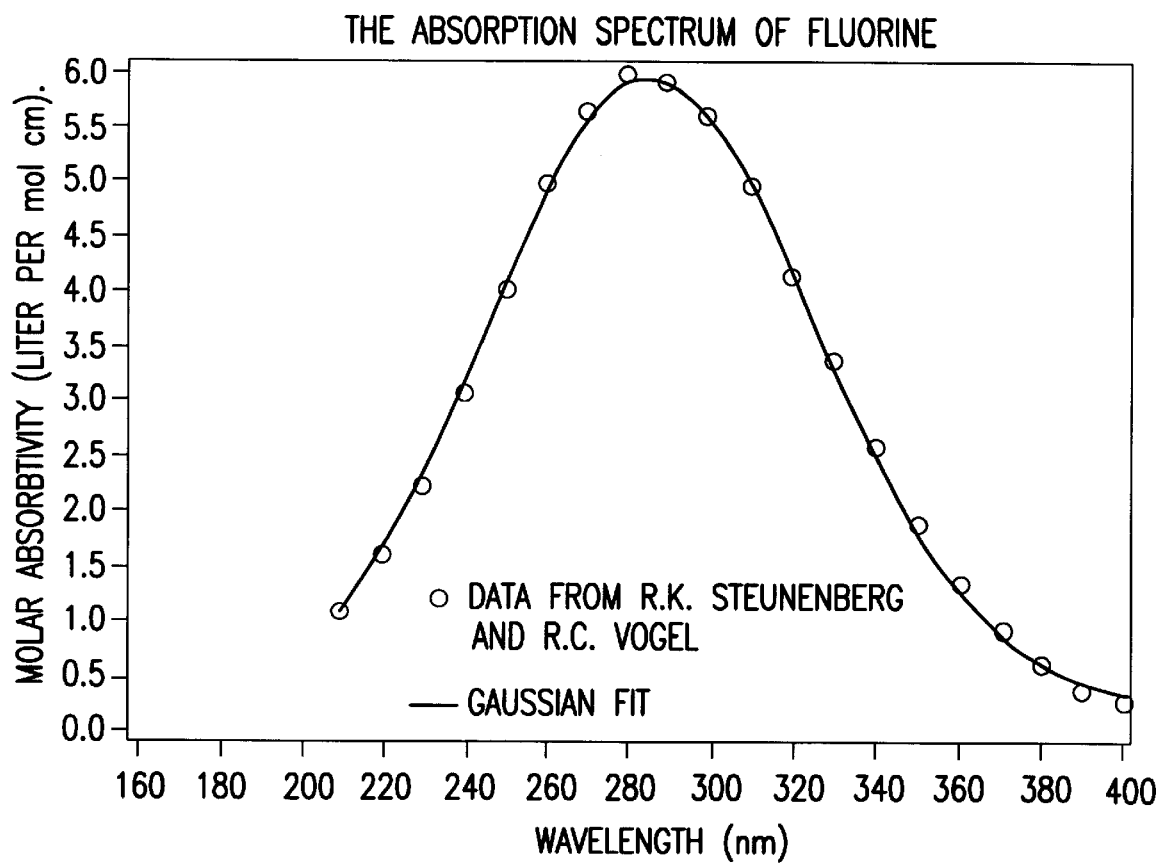
FIG. 10 is a graph of the $F_2$ absorption spectrum.

A third preferred embodiment of the present invention is shown in FIG. 8. In this embodiment, light from a $D_2$ lamp 80 is filtered by filter 82 selected to pass UV light having a high absorption in $F_2$ gas in the range about 240 nm to 340 nm as shown in FIG. 10. The beam is collimated by condenser lens 84 and P polarized with respect to windows 86 and 88 of $F_2$ cell 90 by polarizer 92 and chopped by chopper 94 to produce a pulsed beam pulsing at 2885 Hz. $F_2$ cell 90 is cylindrical having an inside diameter A of 20 cm with windows positioned on a diameter B of 12.6 cm. The beam intersects windows 86 and 88 at Brewster's angle which is about 56° for $CaF_2$ windows having an index of refraction n of about 1.47 at 248 nm to prevent reflection at the inside surface of window 88. This results in a cell length C of 8.3 cm. Gas from the trap 16 enters and leaves the $F_2$ cell at nodes 96A and 96B of an acoustic standing wave in cell 90 created by the periodic expansion of $F_2$ gas resulting from absorption in the gas of the pulsed UV light beam. Gas from cell 90 returns to chamber 6 through chamber window housing 18. Microphone 98 located on the axis of cell 90 detects an acoustic signal which is a function of the $F_2$ concentration in the cell. The chopping frequency of 2885 Hz is based on the chamber dimensions given above and neon gas at a temperature of 50° C. which is the normal nominal temperature of the laser gas in chamber 6. The signal from microphone 98 is used by gas controller 27 to calculate the $F_2$ concentration based on a comparison with previously stored calibration data. Since the resonant frequency of the cell 90 can vary due to changes in temperature or gas composition, the chopper frequency must be adjusted so as to maintain a resonant condition. This might be done by maximizing the strength of the acoustic signal, or preferably by using phase sensitive detection methods (phase-locked loops). (A side benefit of this embodiment is that the exact resonant frequency can be used to infer the concentration of Kr in the KrF laser, or Ar in the ArF laser. To use the $F_2$ detector for this purpose, calibration data would preferably be acquired using known quantities of Kr or Ar in the Ne buffer.) Alternatively gas controller could, if desired, correct the calculated concentration values for temperature variations using calibration data. Gas controller 27 regulates the flow of gas from gas source 34 (and possibly source 36) through valve 32 (and possibly valve 38) to maintain the $F_2$ concentration in the chamber at a predetermined desired concentration.

It is important that an acoustic standing wave be generated in cell 90 so the dimension A, B and C, the gas temperature and the corresponding pulse frequency all should be properly matched to create the standing wave. Other configurations could be utilized based on the parameters listed in Table I below.

TABLE I

| Parameter | Formula | Example |
|---|---|---|
| A (cm) | A | 20 cm |
| B (cm) | 0.6276A | 12.6 cm |
| C (cm) | 0.6276A/n | 8.3 cm |
| F (chop/frequency) (Hz) | 3211 √T/A | 2885 Hz @ 50° C. in Ne |

Fourth Preferred Embodiment

Figure 9:
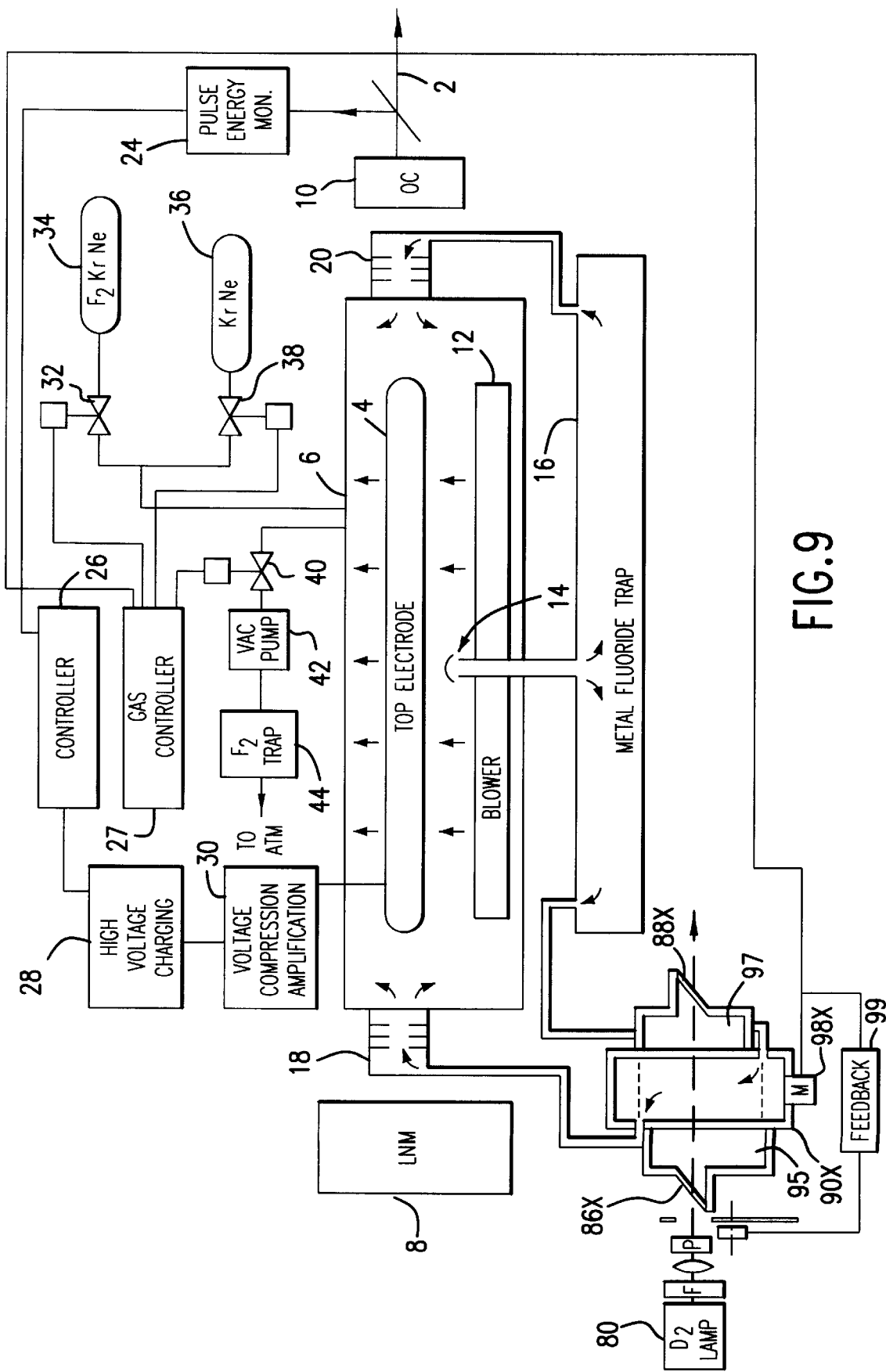

A fourth preferred embodiment is shown in FIG. 9. This embodiment is very similar to the third preferred embodiment. In this case the light from $D_2$ lamp passes through the cell 90X along the axis of the cell. Light from $D_2$ lamp 80 enters and leaves the cell through Brewster's windows 86X and 88X mounted on buffer chambers 95 and 97. Laser gas enters and leaves at nodes 96A and 96B as in the third preferred embodiment. In this case microphone 98X is mounted on the circumference of the cell. The internal dimensions of the cell are the same as shown in Table I, except there is no restriction on the value of C.

Fused silica windows could be used and this would require adjustments based on the index of refraction of fused silica. The formula for chop frequency is based on the neon buffer. For other gases the formula is:

$$F = 0.07382 \frac{Co\sqrt{T}}{A}$$

where T is in ° K Co is the speed of sound in the gas in cm/s if A is in cm at 0° C. For helium as the buffer with the same cell, the frequency would be 6401 Hz. In this embodiment and in the third preferred embodiment, a frequency feedback control loop could be provided as shown at 99 in FIG. 9 to continuously adjust the chopper frequency to maintain maximum acoustic signal. Techniques for doing this are varied and well known. This could be done by periodically scanning over a frequency range and selecting the frequency corresponding to maximum acoustic signal or by dithering the frequency to select minimum gradient of Δ signal/ΔF.

Discharge Voltage vs. Fluorine Concentration for Constant Pulse Energy "Sweet Spot"

Figure 1:
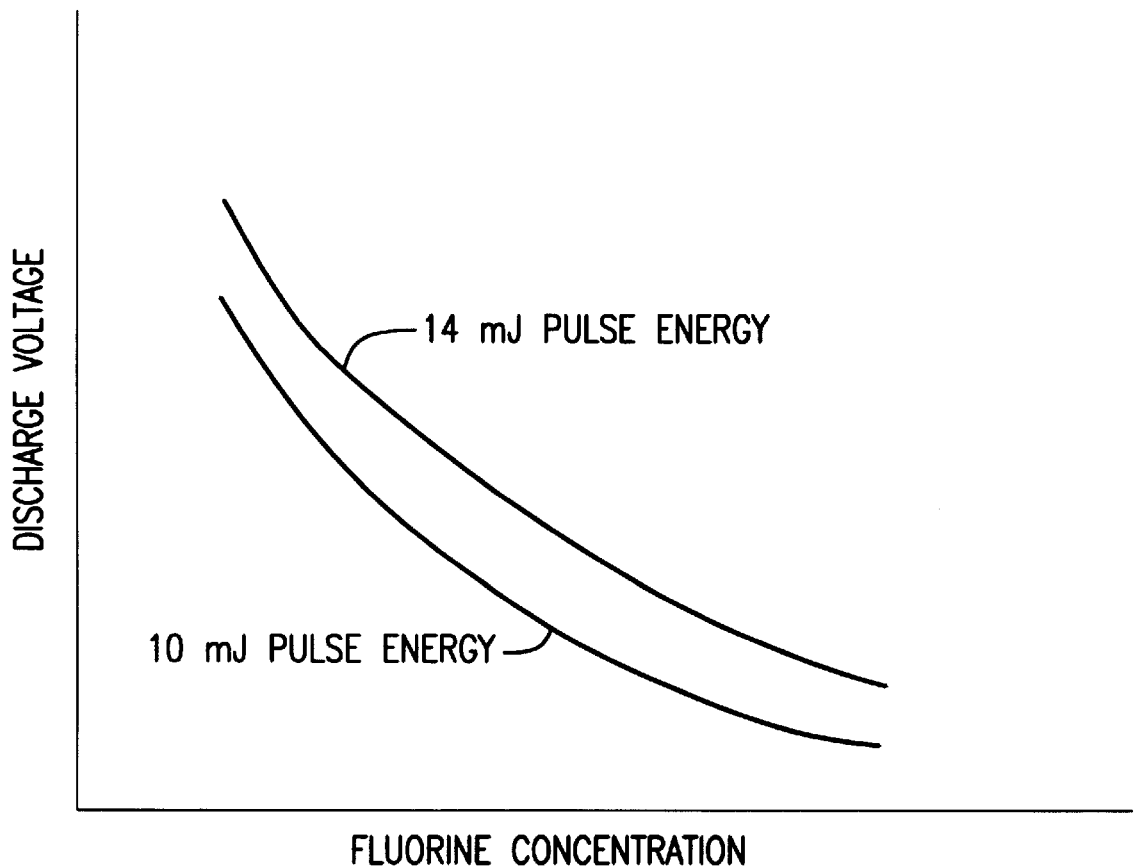
FIG. 1 shows the typical relationship between discharge voltage fluorine concentration and pulse energy.
Figure 3:
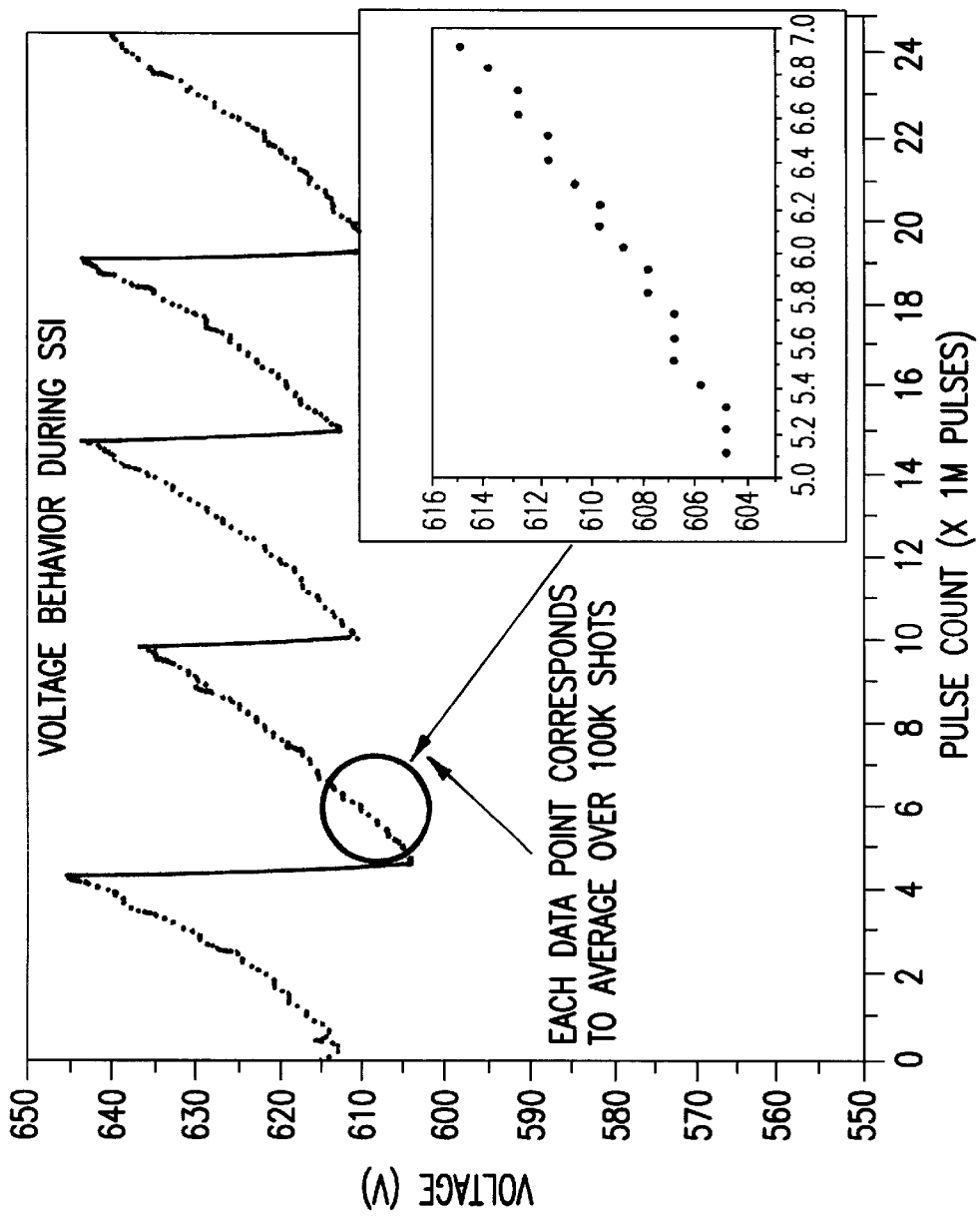
FIG. 3 shows a prior art graphical display of fluorine concentration as a function of pulse count of an operating laser.

As stated in the background section and shown in FIG. 1, the discharge voltage needed to maintain a desired pulse energy is a monotonically decreasing function of fluorine concentration within the desired operating range of the laser. The prior art has demonstrated as shown in FIG. 3 that fairly large swings of discharge voltage and fluorine concentration are possible while keeping the pulse energy output substantially constant. However, wide swings of the discharge voltage and fluorine concentration can result in variations in important laser beam parameters such as wavelength, bandwidth, energy sigma (a measure of the small pulse to pulse energy variations) pulse time profile and spatial profile. Generally there will be a "sweet spot" on the discharge voltage—fluorine concentration (at constant energy) graph at which the above beam parameters are optimized. Such "sweet spot" may be chosen based by the laser operator making trade-off decisions regarding which of the beam parameters are more important while keeping all beam parameters within desired specification ranges. A process for determining the "sweet spot" is described in U.S. patent application Ser. No. 08/915,030 which is incorporated herein by reference.

This process is summarized as follows:
1. Fill the laser with a quantity of fluorine such that the desired pulse energy will be produced with a charging voltage near the upper limit of the charging voltage range.
2. Measure charging voltage (or use control voltage as an excellent estimate of the actual charging voltage), line width and energy sigma.
3. Bleed laser gas (which is about 0.09% fluorine) until the chamber pressure decreases 2 kPa. Increase the fluorine concentration by adding sufficient at 1% fluorine to increase the chamber pressure 2 kPa.
4. Repeat step 2.
5. Repeat steps 3 and 4 until the discharge voltage is near its bottom limit.
6. Plot the data and select the fluorine concentration sweet spot.

Table II shows a typical set of data and this data is plotted in FIG. 10 and a sweet spot of 28.5 kPa (representing 1% $F_2$) about 285 Pa (pure fluorine) is chosen. With a real time fluorine monitor as shown in FIG. 4 or FIG. 5, values of fluorine concentration are measured by the monitor should be included with the Table I data.

TABLE II

| Number of Injects | Cumulative F2 pressure (kPa) | Average Voltage (Volts) | Linewidth (pm) | Energy Sigma (%) |
|---|---|---|---|---|
| 0 | 18.5 | 790 | 0.44 | 2.5 |
| 1 | 20.5 | 690 | 0.44 | 1.9 |
| 2 | 22.5 | 632 | 0.45 | 1.6 |
| 3 | 24.5 | 618 | 0.46 | 1.5 |
| 4 | 26.5 | 598 | 0.47 | 1.7 |
| 5 | 28.5 | 584 | 0.49 | 1.7 |
| 6 | 30.5 | 575 | 0.49 | 1.7 |
| 7 | 32.5 | 571 | 0.5 | 1.8 |
| 8 | 34.5 | 568 | 0.51 | 1.8 |
| 9 | 36.5 | 567 | 0.52 | 1.8 |

Operating within Fluorine "Sweet Spot" Without Fluorine Monitor

Once the sweet spot is determined, operation within it could be accomplished by:
(1) monitoring the pulse energy and providing a feedback mechanism to very rapidly and automatically adjust the discharge voltage as necessary to keep the pulse energy within a desired very narrow range and (2) then monitoring the discharge voltage (or control voltage) and injecting fluorine as necessary to keep the discharge voltage within a desired sweet spot corresponding to a desired fluorine concentration as determined by the curve of charging voltage vs. fluorine concentration.

While the invention has been described in detail herein in accord with certain preferred embodiments thereof, many modifications and changes therein may be effected by those skilled in the art. Persons skilled in the art will recognize that the principals discussed above with respect to KrF excimer lasers will apply equally well to ArF excimer lasers. Persons skilled in the art of excimer laser design will also recognize that the feedback control system could be used to purposely vary the fluorine concentration on a substantially real time basis either for the purpose of producing a laser beam having a time variation or for the purpose of maintaining the beam parameters constant in which case the fluorine variation would be chosen to compensate for some effect which would otherwise have produced a time variation in the beam output. Accordingly, it is intended by the appended claims to cover all such modifications and changes as fall within the true spirit and scope of the invention.

What is claimed is:

1. An excimer laser system comprising:
   A) a laser chamber containing:
      1) two spaced apart elongated electrodes;
      2) a laser gas comprising:
         at least one noble gas and fluorine,
      3) two window housings each housing a window,
   B) a blower for flowing the laser gas between the two spaced apart electrodes;
   C) a fluorine source;
   D) a metal fluoride trap;
   E) a fluorine monitor comprising an absorption cell and a light source for producing light in said absorption cell in a spectral range of relatively high absorption in $F_2$ gas,
   F) a gas sampling circulation system for extracting a first small portion of said laser gas downstream of said blower directing said small portion to said metal fluoride and then directing all or a second portion of said first small portion through said sample cell and then to one of said window housings;
   G) a fluorine control system to regulate the concentration of fluorine gas in said laser chamber based on signals from said fluorine washer.

2. An excimer laser system as in claim 1 wherein said light source is an ultraviolet light source.

3. An excimer laser system as in claim 2 wherein said monitor further comprises a light detector and an optical system to direct a portion of ultraviolet light from said light source through said absorption cell to said light detector.

4. An excimer laser system as in claim 3 wherein said fluorine monitor also comprises a reference cell.

5. An excimer laser system as in claim 1 wherein said fluorine monitor also comprises a filter device comprising a plurality of filters and a means for successively placing each filter in said plurality of filters in said beam of ultraviolet lights.

6. An excimer laser system as in claim 1 wherein said excimer laser system is a KrF laser system and said at least one noble gas is krypton and also comprising neon as a buffer gas.

7. An excimer laser system as in claim 1 wherein said excimer laser system is an ArF laser system and said at least one noble gas is argon and also comprising neon as a buffer gas.

8. An excimer laser system as in claim 1 wherein said excimer laser system is an $F_2$ laser system.

9. An excimer laser system as in claim 1 wherein said fluorine control system comprises temperature and pressure sensors and a processor programmed to adjust fluorine injection based on temperature deviations from a reference temperature.

10. An excimer laser system as in claim 1 wherein said laser feedback control system is programmed to control fluorine flow to keep said laser operating within a predetermined sweet spot.

11. An excimer laser system as in claim 10 wherein sweet spot is defined as a range of fluorine concentration.

12. An excimer laser system as in claim 10 wherein said sweet spot is defined by a slope of a voltage vs. $F_2$ concentration curve.

13. An excimer laser system as in claim 12 wherein said fluorine control system is programmed to inject fluorine at intervals close enough together to simulate continuous injection in order to permit a voltage defined sweet spot no larger than about 2 percent of the nominal sweet spot voltage.

14. An excimer laser system as in claim 1 wherein said fluorine source is a source of substantially 100% fluorine.

15. An excimer laser system as in claim 1 wherein said feedback fluorine control system is programmed to increase the chamber gas pressure as the chamber ages.

16. An excimer laser system as in claim 2 wherein said fluorine monitor is an acoustic monitor and comprises a pulse light source at least a portion of which is within a spectral range of relatively high absorption in $F_2$ gas, and further comprises a microphone for monitoring acoustic waves in said absorption cell.

17. An excimer laser system as in claim 16 wherein said absorption cell is configured to establish at least one acoustic standing wave.

18. An excimer laser system as in claim 17 wherein said absorption cell comprises an entrance port and an exit port located at node locations of said at least one standing wave.

19. An excimer laser system as in claim 18 wherein said absorption cell comprises two windows to permit entrance and exit of light from said pulse light source wherein each of said two windows are located at a node location of said at least one standing wave.

20. An excimer laser system as in claim 18 wherein said absorption cell comprises a cylindrical internal cavity defining an axis and further comprises two windows positioned on said axis.

21. An excimer laser system as in claim 20 wherein said absorption cell also comprises two buffer cavities.

22. An excimer laser system comprising:
   A) a laser chamber containing:
      1) two spaced apart elongated electrodes;
      2) a laser gas comprising:
         at least one noble gas and fluorine,
      3) two window housings each housing a window,
   B) a blower for flowing the laser gas between the two spaced apart electrodes;
   C) a fluorine source;
   D) a metal fluoride trap;
   E) a fluorine monitor comprising an absorption cell and a light source for producing light in said absorption cell in a spectral range of relatively high absorption in $F_2$ gas,
   F) a gas sampling circulation system for extracting a first small portion of said laser from said laser chamber and directing said small portion through said sample cell;

G) a fluorine control system to regulate the concentration of fluorine gas in said laser chamber based on signals from said fluorine washer.

23. An excimer laser system as in claim 1 wherein said light source is an ultraviolet light source.

24. An excimer laser system as in claim 22 wherein said excimer laser system is a KrF laser system and said at least one noble gas is krypton and also comprising neon as a buffer gas.

25. An excimer laser system as in claim 22 wherein said excimer laser system is an ArF laser system and said at least one noble gas is argon and also comprising neon as a buffer gas.

26. An excimer laser system as in claim 22 wherein said excimer laser system is an $F_2$ laser.

27. An excimer laser system as in claim 22 wherein said fluorine control system comprises temperature and pressure sensors and a processor programmed to adjust fluorine injection based on temperature deviations from a reference temperature.

28. An excimer laser system as in claim 1 wherein said fluorine control system is programmed to control fluorine flow to keep said laser operating within a predetermined sweet spot.

29. An excimer laser system as in claim 28 wherein sweet spot is defined as a range of fluorine concentration.

30. An excimer laser system as in claim 28 wherein said sweet spot is defined by a slope of a voltage vs. $F_2$ concentration curve.

31. An excimer laser system as in claim 12 wherein said fluorine control system is programmed to inject fluorine at intervals close enough together to simulate continuous injection in order to permit a voltage defined sweet spot no larger than about 2 percent of the nominal sweet spot voltage.

32. An excimer laser system as in claim 22 wherein said fluorine source is a source of substantially 100% fluorine.

33. An excimer laser system as in claim 22 wherein said feedback fluorine control system is programmed to increase the chamber gas pressure as the chamber ages.

34. An excimer laser system as in claim 22 wherein said fluorine monitor is an acoustic monitor and comprises a pulse light source at least a portion of which is within a spectral range of relatively high absorption in $F_2$ gas, and further comprises a microphone for monitoring acoustic waves in said absorption cell.

35. An excimer laser system as in claim 34 wherein said absorption cell is configured to establish at least one acoustic standing wave.

36. An excimer laser system as in claim 35 wherein said absorption cell comprises an entrance port and an exit port located at node locations of said at least one standing wave.

37. An excimer laser system as in claim 36 wherein said absorption cell comprises two windows to permit entrance and exit of light from said pulse light source wherein each of said two windows are located at a node location of said at least one standing wave.

38. An excimer laser system as in claim 37 wherein said absorption cell comprises a cylindrical internal cavity defining an axis and further comprises two windows positioned on said axis.

39. An excimer laser system as in claim 38 wherein said absorption cell also comprises two buffer cavities.

* * * * *

UNITED STATES PATENT AND TRADEMARK OFFICE
CERTIFICATE OF CORRECTION

PATENT NO. : 6,240,117 B1  
DATED : May 29, 2001  
INVENTOR(S) : Mengxiong Gong, et al.

It is certified that error appears in the above-identified patent and that said Letters Patent is hereby corrected as shown below:

<u>Column 9,</u>  
Line 46, delete "washer" and insert -- monitor --.

<u>Column 11,</u>  
Line 3, delete "washer" and insert -- monitor --.

Signed and Sealed this

Fifth Day of March, 2002

*Attest:*

JAMES E. ROGAN  
*Director of the United States Patent and Trademark Office*

*Attesting Officer*

UNITED STATES PATENT AND TRADEMARK OFFICE
CERTIFICATE OF CORRECTION

PATENT NO. : 6,240,117 B1 Page 1 of 1
DATED : May 29, 2001
INVENTOR(S) : Gong et al.

It is certified that error appears in the above-identified patent and that said Letters Patent is hereby corrected as shown below:

Column 5,
Line 35, change "detures" to -- detours --.

Column 9,
Line 41, after "ride" (fluo-ride), insert -- trap --.

Column 10,
Line 66, after "laser", first occurrence, insert -- gas --.
Line 67, change "sample" to -- absorption --.

Signed and Sealed this

Thirtieth Day of May, 2006

JON W. DUDAS
*Director of the United States Patent and Trademark Office*